(12) United States Patent
Lanzerstorfer et al.

(10) Patent No.: US 6,605,841 B2
(45) Date of Patent: Aug. 12, 2003

(54) METHOD FOR PRODUCING AN ELECTRODE BY MEANS OF A FIELD EFFECT CONTROLLABLE SEMICONDUCTOR COMPONENT AND FIELD-EFFECT-CONTROLLABLE SEMICONDUCTOR COMPONENT

(75) Inventors: Sven Lanzerstorfer, Feldkirchen (AT); Hubert Maier, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/034,052

(22) Filed: Dec. 20, 2001

(65) Prior Publication Data

US 2002/0100923 A1 Aug. 1, 2002

(30) Foreign Application Priority Data

Dec. 20, 2000 (DE) .......................... 100 63 443

(51) Int. Cl.[7] ............................................. H01L 29/772
(52) U.S. Cl. .................... 257/329; 257/249; 257/328
(58) Field of Search ........................... 257/249, 328, 257/329, 621

(56) References Cited

U.S. PATENT DOCUMENTS 6,144,054 A * 11/2000 Agahi et al. ............... 257/296
6,215,149 B1 * 4/2001 Lee et al. ................... 257/302
2002/0066926 A1 * 6/2002 Hshieh et al. .............. 257/330
2002/0088989 A1 * 7/2002 Kim .......................... 257/135

FOREIGN PATENT DOCUMENTS

| DE | 198 00 340 A1 | 7/1999 | |
|---|---|---|---|
| DE | 198 45 315 A1 | 9/1999 | |
| EP | 1 037 285 A1 | 9/2000 | |
| EP | 1 085 577 A2 | 3/2001 | |
| JP | 05218342 A * | 8/1993 | ......... H01L/27/108 |

* cited by examiner

Primary Examiner—Allan R. Wilson
(74) Attorney, Agent, or Firm—Laurence A. Greenberg; Werner H. Stemer; Ralph E. Locher

(57) ABSTRACT

A field-effect-controllable semiconductor component and a method for fabricating an electrode of the component includes a semiconductor body having a first zone of a first conduction type, a second zone of a second conduction type disposed above the first zone, and at least one trench extending into the semiconductor body in a vertical direction through the second zone, applying a first insulation layer at least in a region of the second zone in the trench, applying a first layer of electrode material to the semiconductor body, applying an intermediate layer to the first layer, applying a second layer of electrode material to the intermediate layer, removing a portion of the second layer and of the intermediate layer to leave the intermediate layer and the second layer at least partly in the trench, and patterning the first layer.

10 Claims, 17 Drawing Sheets

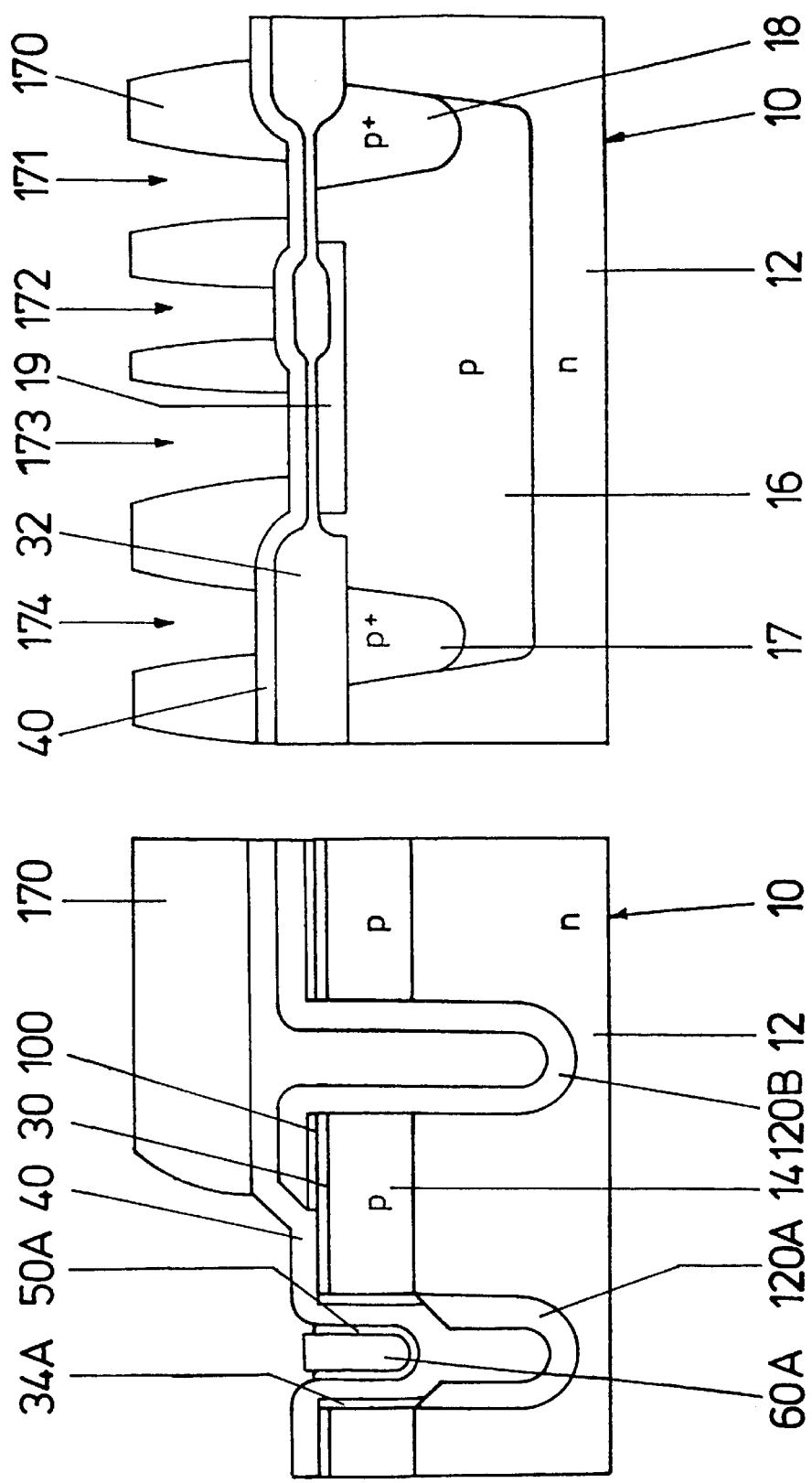

METHOD FOR PRODUCING AN ELECTRODE BY MEANS OF A FIELD EFFECT CONTROLLABLE SEMICONDUCTOR COMPONENT AND FIELD-EFFECT-CONTROLLABLE SEMICONDUCTOR COMPONENT

BACKGROUND OF THE INVENTION

The present invention relates to a method for fabricating an electrode of a field-effect-controllable semiconductor component and to a field-effect-controllable semiconductor component.

In the course of an increasing integration density in integrated circuits, endeavors are made to integrate power transistors, in particular power field-effect transistors, and their associated drive circuit or drive logic in a semiconductor body.

Power transistors are usually transistors of vertical design, i.e. source and drain terminals of the transistors are situated on opposite sides of the semiconductor body, in which case the gate electrode can be arranged in a trench in a manner insulated from the semiconductor body. In components of this type, a conductive channel runs through the semiconductor body in the vertical direction. By contrast, components, in particular transistors, of the drive circuit are usually designed as lateral components, i.e. the terminals of these transistors are situated at one side of the semiconductor body and a conductive channel in the case of these transistors usually forms in the lateral direction in the semiconductor body. The different geometrical construction of the power transistors and of the transistors of the drive logic means that different method steps are required to fabricate them.

This does not constitute a problem if the power transistors and the drive logic are realized in different semiconductor bodies. However, if the power transistors and the components of the drive logic are intended to be integrated in a single semiconductor body, there is a need to be able to jointly utilize as many method steps as possible for the power transistor part and the drive logic part. Problems are posed here in particular by the fabrication of electrodes of the power transistors and of the transistors of the drive logic.

In the case of transistors of lateral design, the control electrodes, i.e. the gate electrodes in field-effect transistors, are fabricated by depositing an electrode layer onto an insulation layer on the semiconductor body. In the case of vertical power transistors designed as so-called trench transistors, in which the control electrode is thus formed in a trench of the semiconductor body, the trench is filled with an electrode material after the fabrication of an insulation layer at the trench surface, for this purpose an electrode material usually being deposited onto the semiconductor body, and hence also into the trenches. The thickness of the electrode material that is to be deposited in this case is dependent on the width of the trench which is to be filled. Thus, the thickness of the deposited electrode material must approximately correspond to the trench width in order to fill the trench by deposition of the electrode material and to obtain an approximately planar surface after etching-back of the electrode layer on the surface of the semiconductor body. In the case of trenches having a width of 800 nm, it is customary at the present time to deposit an electrode layer having a thickness of approximately 1 $\mu$m. However, an electrode layer this thick is not suitable for fabricating gate electrodes of the drive logic, for which a thinner electrode layer has to be provided.

SUMMARY OF THE INVENTION

It is an aim of the present invention, therefore, to provide a method for fabricating an electrode of a field-effect-controllable semiconductor component which can equally be used for fabricating an electrode of a power transistor and for fabricating an electrode of a transistor of a drive logic.

This aim is achieved by a method for fabricating an electrode of a field-effect-controllable semiconductor component, the method having the steps of providing a semiconductor body having a first zone of a first conduction type and, disposed above the latter, a second zone of a second conduction type, and at least one trench that extends into the semiconductor body in the vertical direction through the second zone, fabricating a first insulation layer at least in the region of the second zone in the at least one trench, applying a first layer made of electrode material to the semiconductor body, applying an intermediate layer to the first layer made of electrode material, applying a second layer made of electrode material to the intermediate layer, removing the second layer made of electrode material and of the intermediate layer, the intermediate layer and the second layer made of electrode material at least partly remaining in the at least one trench, and patterning the first layer made of electrode material.

The subclaims relate to advantageous refinements of the method according to the invention.

In the method according to the invention, firstly provision is made of a semiconductor body having a first zone of a first conduction type and, arranged above the latter, a second zone of a second conduction type, and at least one trench which extends into the semiconductor body in the vertical direction through the second zone. The fabrication of such a semiconductor body with the features mentioned is adequately known from methods for fabricating power transistors. Afterward, a first insulation layer is fabricated at least in the region of the second zone in the at least one trench. This insulation layer may be, in particular, a layer made of an oxide of the semiconductor material which is produced by means of a thermal method. Afterward, a layer made of electrode material is deposited onto the semiconductor body and hence also in the at least one trench. In a next method step, an intermediate layer is applied to said first layer made of electrode material, on which intermediate layer a second layer made of electrode material is then applied. The second layer made of electrode material and the intermediate layer are then removed above the semiconductor body, the intermediate layer and the second layer made of electrode material at least partly remaining in the trench. Afterward, the first layer made of electrode material is patterned in order to form the electrode.

The present method, in which an electrode of a field-effect-controllable semiconductor component is fabricated by deposition of a first electrode layer, an intermediate layer and a second electrode layer, is suitable both for fabricating a control electrode of a power transistor in a trench of the semiconductor body and for fabricating a control electrode—arranged on a surface of the semiconductor body—of a transistor of lateral design. In this case, the thickness of the first electrode layer is chosen in such a way that it is suitable for forming a control electrode, or gate electrode, of a lateral transistor of the drive logic. In this case, this electrode layer is usually so thin that the trenches of the later power transistor are not completely filled. In the method according to the invention, the trenches are filled by means of the second electrode layer which is deposited onto the intermediate layer and whose thickness is chosen in such a way that the trenches are completely filled. After the removal of the second electrode layer and the intermediate layer from regions above the semiconductor body, only the first thinner electrode layer remains on the semiconductor body for the as purpose of forming control electrodes of the drive logic, while the trenches are completely filled by the first thinner electrode layer and the second electrode layer applied above the latter. In the method according to the invention, the intermediate layer serves in particular as a stop layer during an etching operation in which the second electrode layer is removed from the surface of the semiconductor body. The intermediate layer is subsequently removed in a further method step.

In accordance with one embodiment of the invention, it is provided that before the fabrication of the first insulation layer in the at least one trench, a second insulation layer is fabricated which at least partly covers the surface of the at least one trench. This second insulation layer is thicker than the first insulation layer and covers the surface of the at least one trench preferably below the second zone. The thickness of this second insulation layer is preferably chosen in such a way that, after the fabrication of the first insulation layer in the trench in the region of the second zones and the deposition of the first layer made of electrode material, the trench is completely filled with electrode material where the second insulation layer is applied.

As already mentioned, in vertical power transistors, a conductive channel runs in the vertical direction in the semiconductor body. In transistors it is known to arrange so-called field plates along the conductive channel, the use of which field plates makes it possible to achieve a lower resistance of the transistor in the on state with a breakdown voltage that remains the same or is increased. In this case, that section of the first electrode layer which is arranged on the second insulation layer in the region of the first zone of the semiconductor body in the trench acts as such a field plate.

In accordance with a further embodiment of the invention, it is provided that the semiconductor body has at least two trenches, in which case, before the method step for fabricating the first electrode layer in one of the trenches, a second insulation layer is fabricated which covers the surface of the trench in the region of the first zone and second zone of the semiconductor body. In this case, the thickness of this second insulation layer is chosen in such a way that, after the deposition of the first layer made of electrode material, said trench is completely filled with electrode material. It is known to realize power transistors from a plurality of identically constructed cells which are interconnected. The trench which is completely filled with the second insulation layer and the first layer made of electrode material in this case serves for laterally delimiting the cell array, the section of the first layer made of electrode material in this trench acting as a field plate. This field plate is usually connected to the same potential as the control electrodes in the rest of the trenches, the second insulation layer being too thick to allow the field plate to act as a gate electrode.

The present invention furthermore relates to a field-effect-controllable semiconductor component having a semiconductor body with a first zone of a first conduction type, a second zone of a second conduction type, and at least one trench extending into the semiconductor body in the vertical direction of the semiconductor body through the second zone, a control electrode formed in the trench, an insulation layer formed in the trench and insulating the control electrode from the semiconductor body. The control electrode has a first electrode section adjacent to the insulation layer, a second electrode section, and an intermediate layer formed between the first and second electrode sections.

BRIEF DESCRIPTION OF THE DRAWINGS

The present invention is explained below using exemplary embodiments with reference to figures, in which:

FIGS. 2A to 2H show method steps for fabricating an electrode of a field-effect-controllable semiconductor component of a second embodiment of the invention in accordance with a method according to a second embodiment;

DESCRIPTION OF THE PREFERRED EMBODIMENT

In the figures, unless specified otherwise, identical reference symbols designate identical regions with the same meaning.

FIGS. 1A to 1H illustrate a method according to the invention for fabricating an electrode of a field-effect-controllable semiconductor component.

Figure 1A:
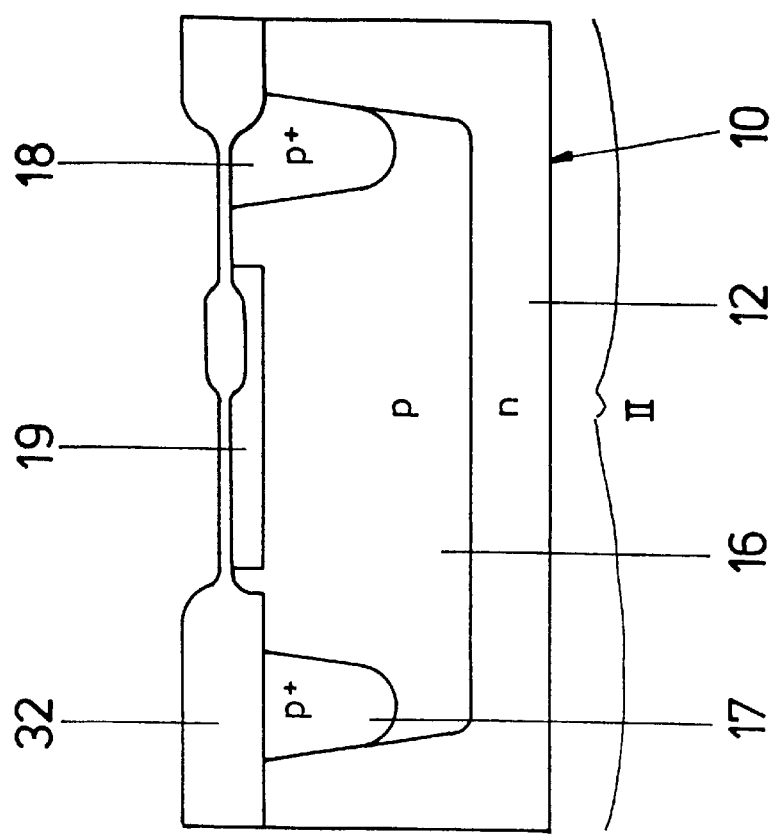
FIGS. 1A to 1H show method steps for fabricating an electrode of a field-effect-controllable semiconductor component in accordance with a method according to a first embodiment.
Figure 1A:
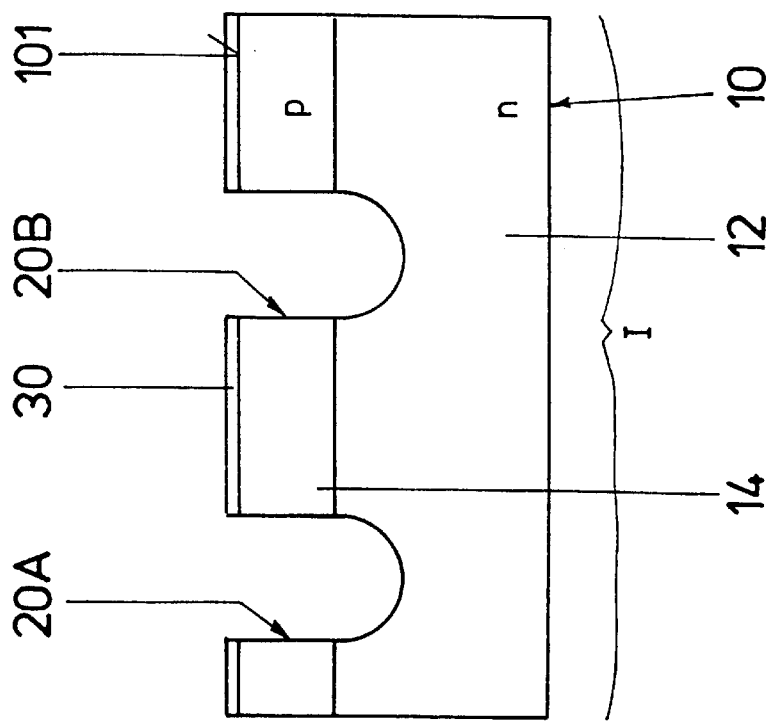

As is illustrated in FIG. 1A, a semiconductor body 10 is provided in this case in a first method step, which semiconductor body has a first zone 12 of a first conduction type, an n-conducting zone in the present case, and, lying above the latter, a zone of a second conduction type, a p-doped zone in the present case. The semiconductor body 10 additionally has at least one trench which extends into the semiconductor body 10 in the vertical direction of the semiconductor body through the second zone 14, two trenches 20A, 20B being illustrated in the exemplary embodiment in FIG. 1A. In addition, an insulation layer 30, for example an oxide made of semiconductor material, is applied to a front side 101 of the semiconductor body 10.

FIG. 1A shows two sections I and II of the same semiconductor body 10, which are arranged spaced apart from one another in the lateral direction of the semiconductor body 10. The part designated by I, which is referred to as power transistor part hereinafter, in this case serves for fabricating a vertical power transistor. The part designated by II, which is referred to as drive logic part hereinafter, in this case serves for fabricating components, in particular transistors, for a drive logic of the power transistor.

By way of example, a p-doped well 16 in the n-doped region 12 of the semiconductor body 10 is illustrated in the drive logic part II, which well is laterally terminated by means of heavily p-doped sidewalls 17, 18. In the present example, the p-doped well 16 shown in the drive part in FIG. 1A serves for fabricating an n-conducting field-effect transistor of lateral design. An n-doped zone 19 formed in the p-doped well 16 below a surface of the semiconductor body 10 serves as a later drift path of the transistor. An insulation layer 32 is applied to the surface of the semiconductor body 10 in the drive logic part II, which insulation layer becomes thicker towards the edges of the p-doped well 16.

Figure 1B:
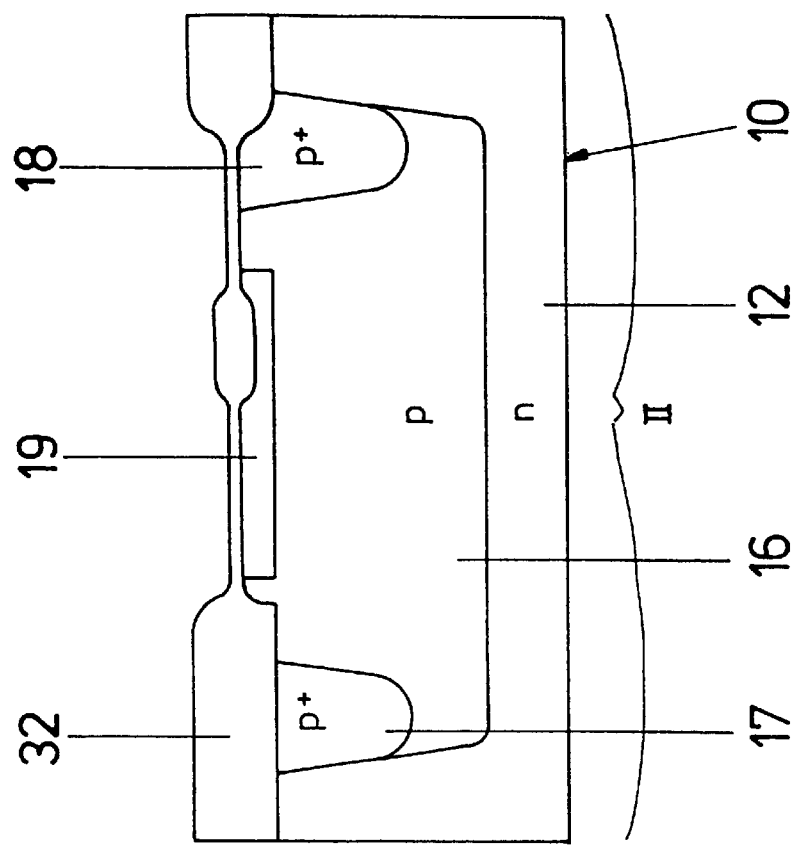
Figure 1B:
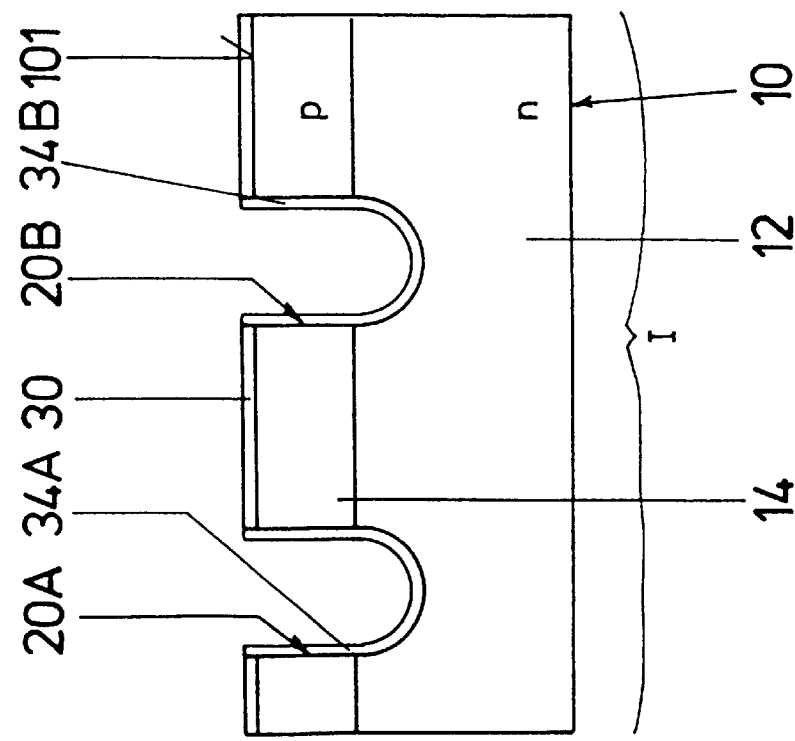

After the provision of the semiconductor arrangement illustrated in FIG. 1A, in a next method step, whose result is illustrated in FIG. 1B, a first insulation layer 34A, 34B is fabricated in the trenches 20A, 20B. This first insulation layer 34A, 34B is preferably fabricated by means of a thermal method during which the semiconductor body is heated, so that the semiconductor material oxidizes at the surface of the trenches 20A, 20B. As a result of this thermal step, the thickness of the insulation layer 30 applied to the front side 101 of the semiconductor body 10 in the power transistor part I and the thickness of the insulation layer 32 in the drive logic part II may also increase, but this is not illustrated in FIG. 1B. The insulation layers 34A, 34B form the gate insulation for the later gate electrodes.

Figure 1C:
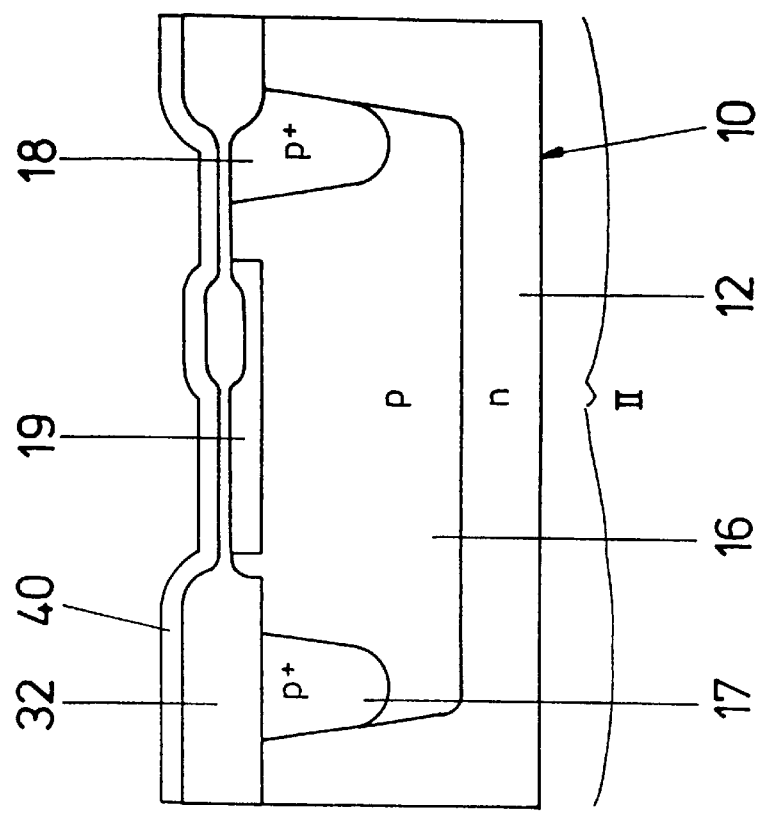
Figure 1C:
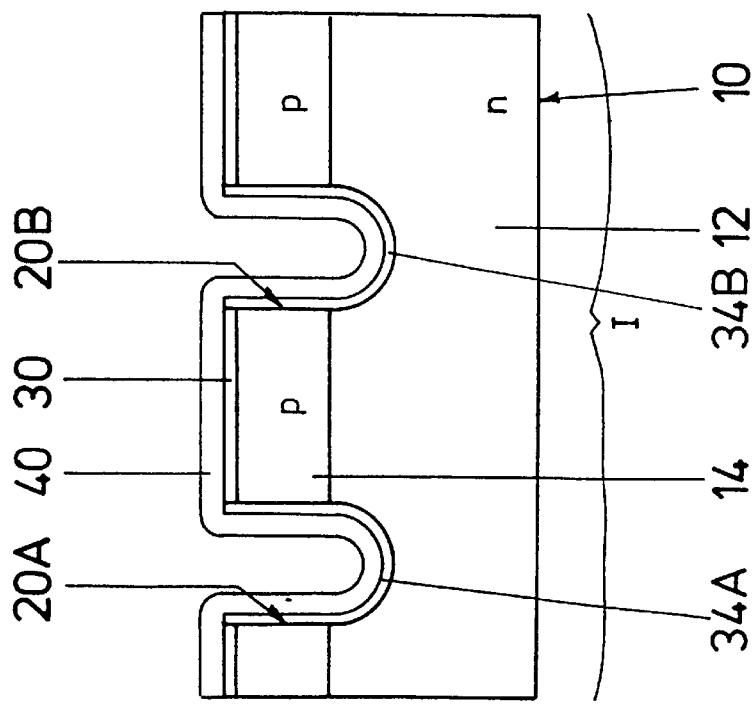

In a next method step, whose result is illustrated in FIG. 1C, a first layer 40 made of electrode material is applied to the semiconductor body 10. If silicon is used as semiconductor material, polysilicon is preferably deposited onto the semiconductor body 10 for this purpose. The first layer 40 made of electrode material is applied over the entire surface of the semiconductor body 10, so that the first layer 40 made of electrode material covers the surface of the trenches 20A, 20B and the regions of the front side 101 of the semiconductor body 10 and, in particular, the semiconductor body in the region of the drive logic part II. In this case, the thickness of the first layer 40 made of electrode material is chosen in such a way that it is suitable for fabricating control electrodes, or gate electrodes, of transistors in the drive logic part.

Figure 1D:
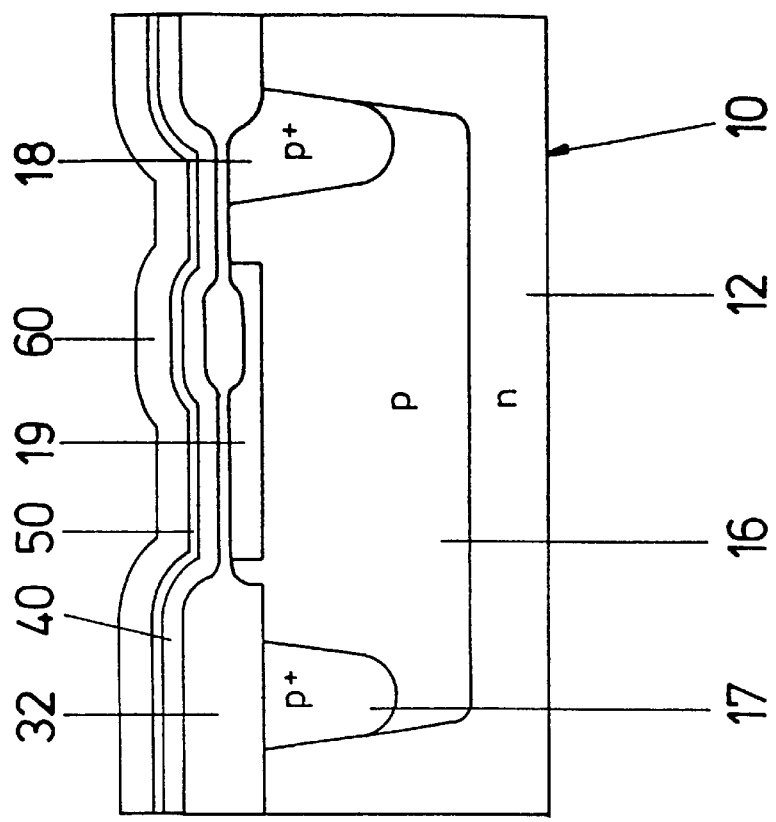
Figure 1D:
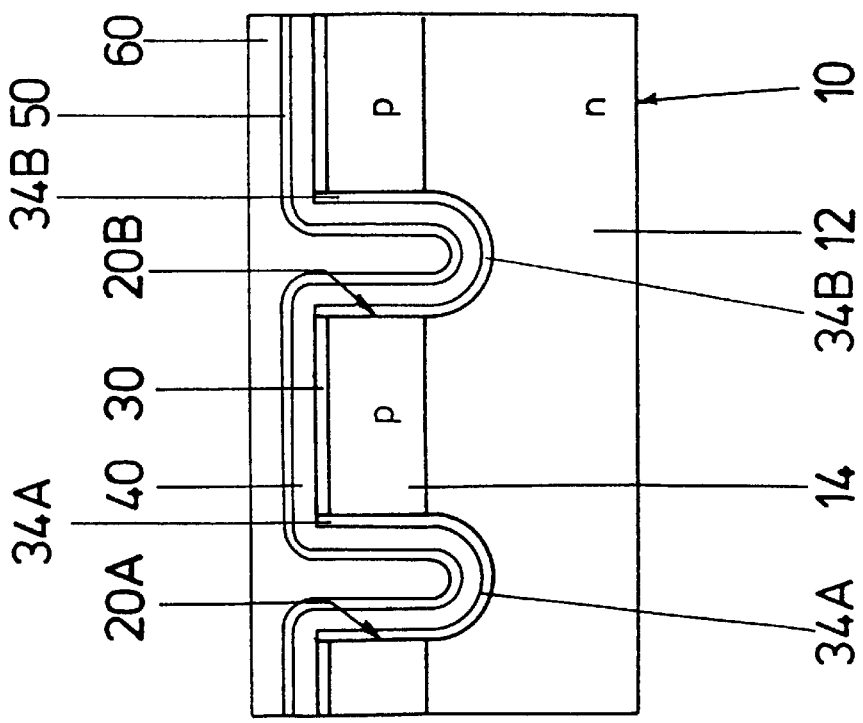

In subsequent method steps, whose result is illustrated in FIG. 1D, firstly an intermediate layer 50 is applied to the first layer 40 made of electrode material and then a second layer 60 made of electrode material is applied to the intermediate layer 50. In this case, the thickness of the applied second layer 60 made of electrode material is chosen in such a way that the trenches 20A, 20B are completely filled by the second layer 60 made of electrode material. The second layer 60 made of electrode material is preferably composed of the same material as the first layer 40 made of electrode material.

Figure 1E:
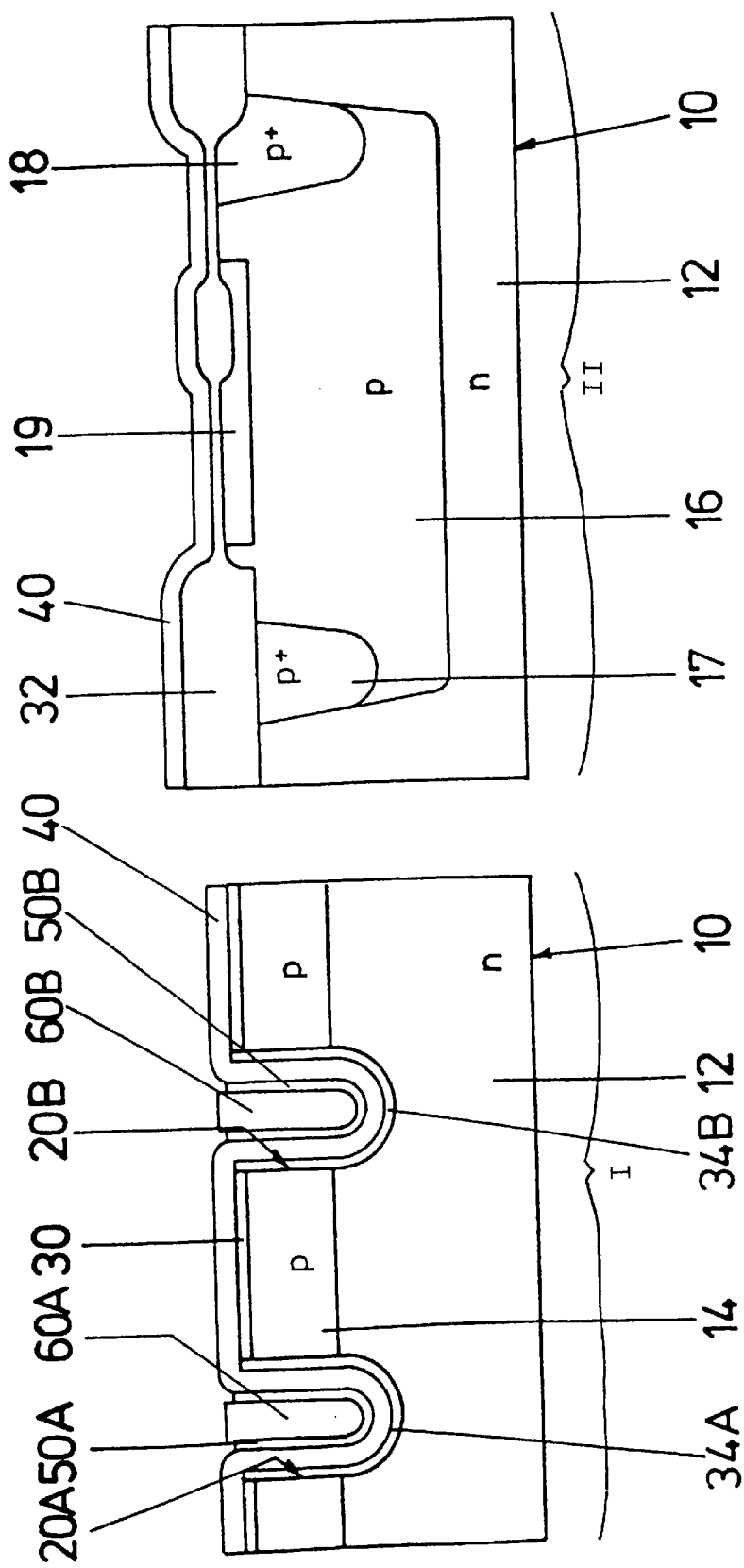

In subsequent method steps, whose result is illustrated in FIG. 1E, the second layer 60 made of electrode material and the intermediate layer 50 are removed above the surface of the semiconductor body 10, sections 50A, 50B of the intermediate layer and sections 60A, 60B of the second layer made of electrode material remaining in the trenches 20A, 20B, in order to fill the trenches. The second layer 60 made of electrode material and the intermediate layer 50 are preferably removed in a plurality of method steps, the second layer 60 made of electrode material being removed in a first method step, for example by etching. In this case, the intermediate layer 50 serves as a stop layer which is not removed by the etching method. If silicon is used as semiconductor material, the intermediate layer is preferably composed of tetraethyl orthosilicate (TEOS). This intermediate layer 50 is then removed in a next method step, in order to attain the arrangement illustrated in FIG. 1E. The electrode layer 40 remaining above the drive logic part II retains its original thickness during the removal of the second electrode layer 60 and the intermediate layer 50. In this case, the thickness of this first electrode layer 40 is chosen in such a way that it is suitable for fabricating electrodes of the lateral transistors of the drive logic part II. The thickness of this first electrode layer 40 is usually too small to enable the trenches 20A, 20B to be completely filled. In the method according to the invention, therefore, the trenches 20A, 20B are completely filled by the second electrode layer 60, or the parts 60A, 60B thereof which remain after the etching-back process.

Figure 1F:
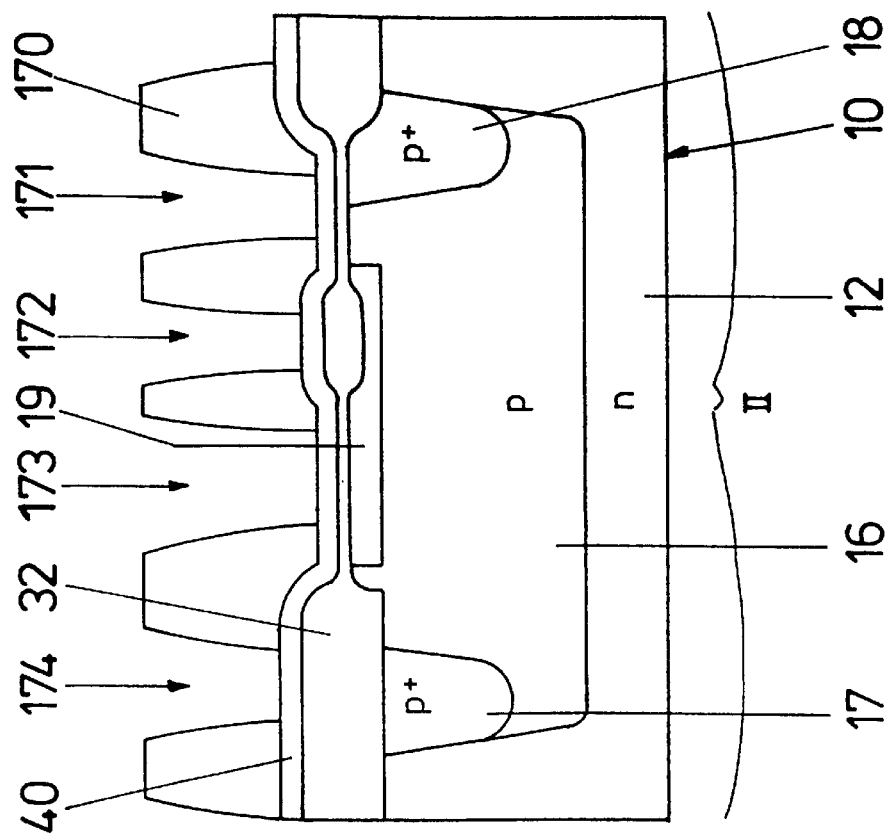
Figure 1F:
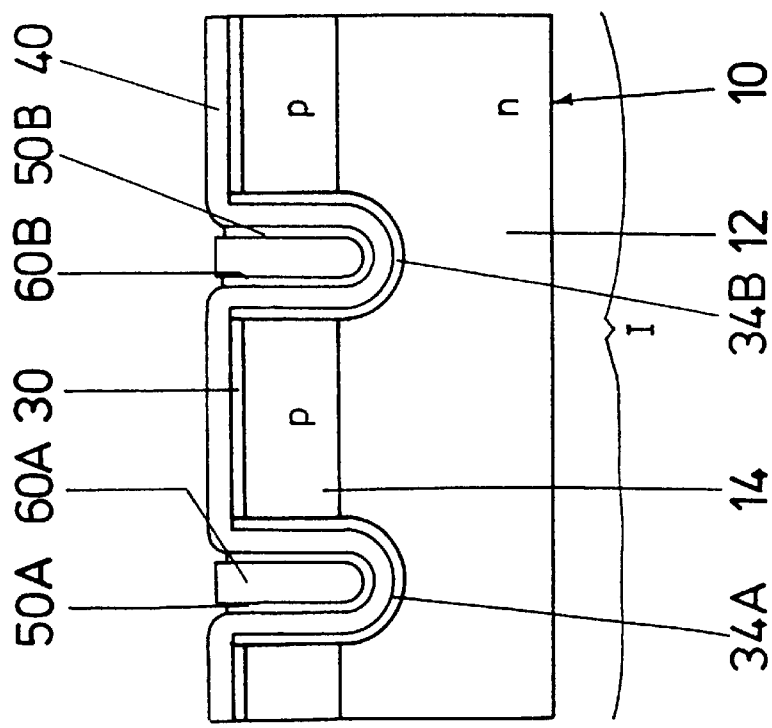
Figure 1G:
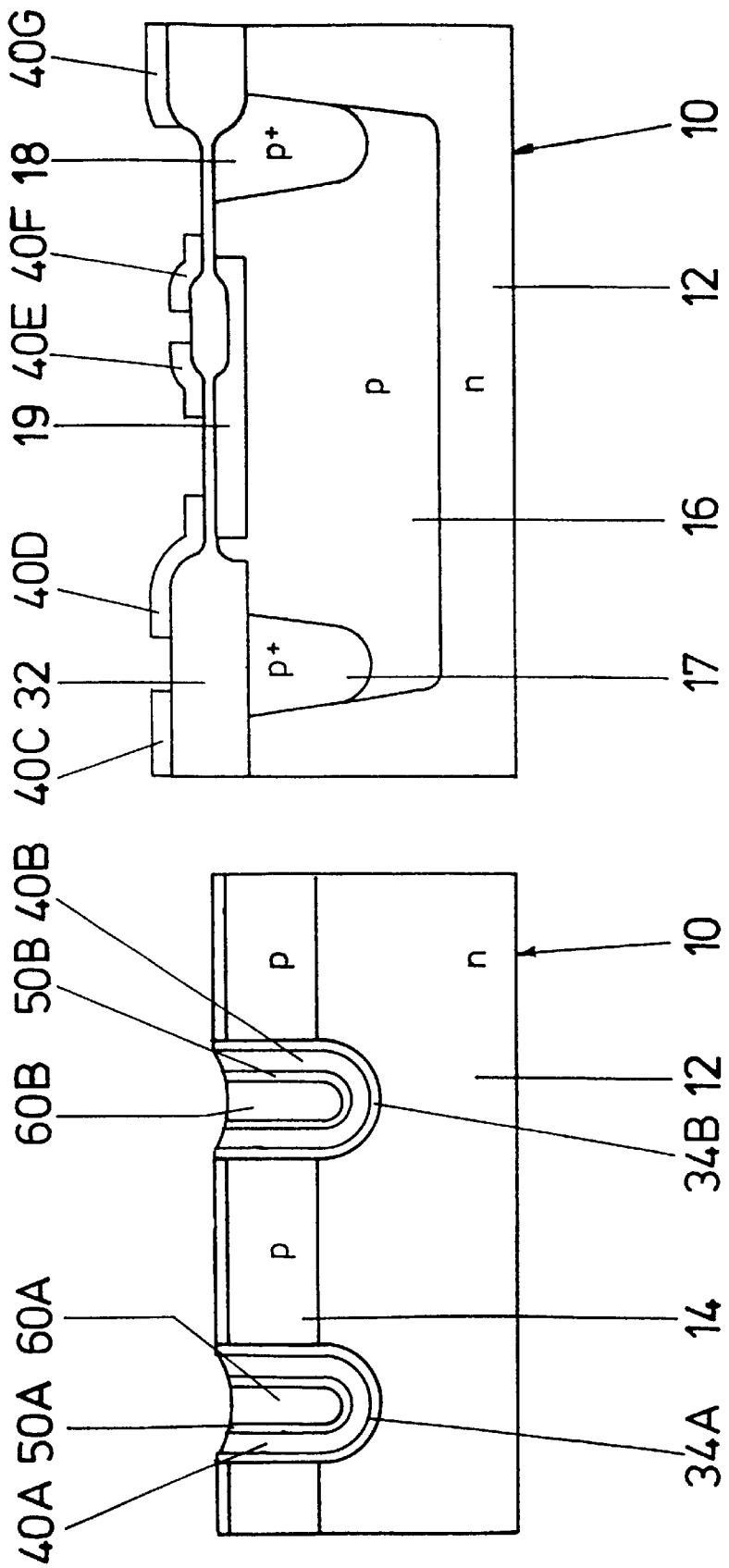

FIG. 1F shows the arrangement in accordance with FIG. 1E after a next method step in which a photomask 170 is applied above the drive logic part II. This photomask 170 has cutouts 171, 172, 173, 174, and, in a next method step, whose result is illustrated in FIG. 1G, the first layer 40 made of electrode material is removed from the regions of the semiconductor body 10 which are not covered by the photomask 170. In the illustration in accordance with FIG. 1G, the photomask 170 has already been removed after the performance of the step for partly removing the first electrode layer 40, which is preferably effected by means of an etching method.

After the partial removal of the first layer made of electrode material, after which sections 40C, 40D, 40E, 40F, 40G of the first layer made of electrode material remain on the surface, there lie free in the power transistor part I and in the drive logic part regions of the surface of the semiconductor body which are covered only by the thin insulation layer 30 in the power transistor part I and, respectively, by thin sections of the insulation layer 32 in the drive logic part II. N-doped zones 70, 72, 74 are then produced in these regions of the semiconductor body 10, for example by means of a diffusion method. In the region of the drive logic part II, these n-doped zones 72, 74 are formed in a well-like manner in the regions of the front side of the semiconductor body 10 which are left free by the remaining sections 40C, 40D, 40E, 40F, 40G of the first layer made of electrode material. In the power transistor part of the semiconductor body 10, the n-doped zone 70 extends between the trenches 20A, 20B below the front side of the semiconductor body 10.

Figure 1H:
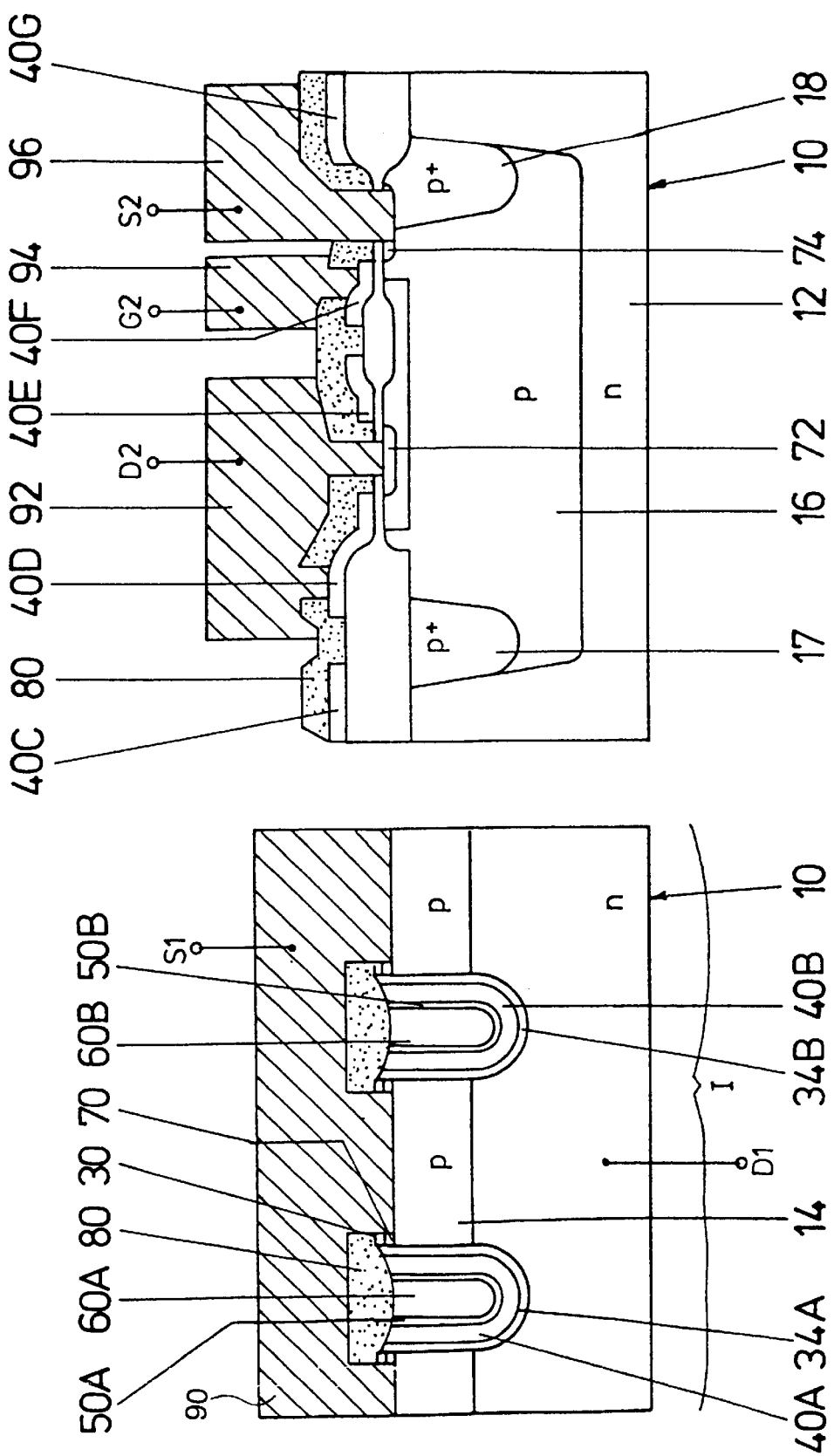

The result of these last-mentioned method steps is illustrated in FIG. 1H. After the indiffusion of the n-doped zones, a further insulation layer 80 is deposited and patterned by means of known method steps, this insulation layer 80 leaving free sections of the surface of the semiconductor body 10 or of the remaining sections 40D, 40F of the electrode layer in order that these regions are contact-connected by means of subsequently applied electrodes. In the region of the power transistor part I, the insulation layer 80 leaves free regions of the surface of the semiconductor body 10, a further electrode, for example made of metal, subsequently being fabricated, which electrode contact-connects the n-doped regions 70 between trenches 20A, 20B. This electrode 90 serves as source electrode S1 of the power transistor and is preferably designed in such a way that it short-circuits the n-doped zones 70 and the p-doped second zone 14. In the power transistor part I, the first n-doped zone 12 of the semiconductor body 10 serves as drain zone D1 and the combination—formed in the trenches 20A, 20B—comprising first electrode layer 40A, 40B and second electrode layer 60A, 60B, which are preferably connected to the same potential, serves as gate electrode of the power transistor. The first electrode layer 40A, 40B is formed as a result of the fabrication method in the trenches 20A, 20B between the second electrode layer 60A, 60B and the sidewalls of the trenches. The first electrode layer 40A, 40B thus partly surrounds the second electrode layer 60A, 60B in the trenches 20A, 20B. When a drive potential is applied to the gate electrode 40A, 60A, 40B, 60B, a conductive channel forms in the p-doped channel zone 14 along the insulation layer 34A, 34B of the trenches, as a result of which a charge flow arises when a voltage is applied between the drain zone D1 and the source electrode S1.

The gate electrodes 40A, 60A, 40B, 60B are connected to one another and to a common drive potential in a manner that is not specifically illustrated in FIG. 1H.

Figure 3:
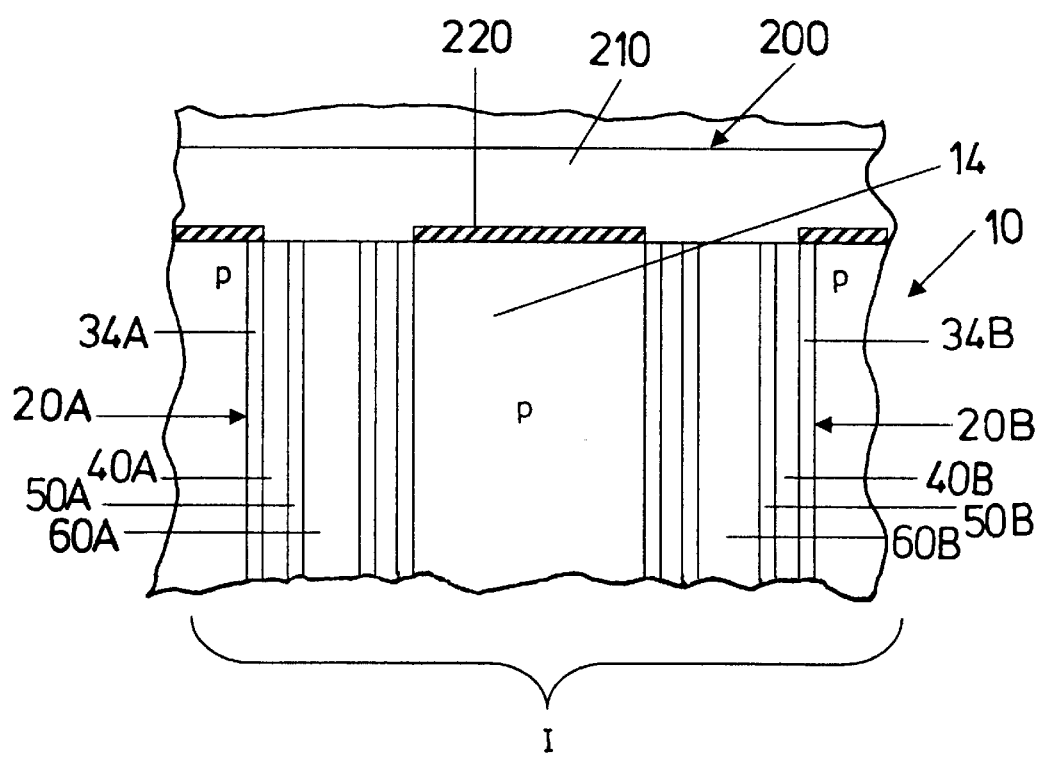
FIG. 3 shows a cross section through a semiconductor component according to the invention for illustrating a possibility for contact connection of a first and second electrode in a trench of a semiconductor body.

For this purpose, as is illustrated in FIG. 3, provision is made of, for example, a further trench 200 in the semiconductor body 10, which runs perpendicularly to the trenches 20A, 20B and in which the connection for the gate electrodes is provided. FIG. 3 shows a cross section through the second zone 14 in the power part I in plan view. The reference symbol 210 in this case designates an electrode which connects the gate electrodes 40A, 60A, 40B, 60B to one another and is insulated from the semiconductor body 10 by means of an insulation layer 220.

In the drive logic part II in accordance with FIG. 1H, a transistor of lateral design is illustrated as a representative of the entire drive logic. In this transistor, the n-doped zone 74 serves as source zone, which is contact-connected by means of a source electrode 96, S2 which short-circuits the n-doped zone and the p-doped well 16 surrounding the n-doped zone 74. Tn the n-doped zone 19, a heavily n-doped zone 72 is formed which serves as drain zone and is contact-connected by means of a drain zone D2, 92. A section 40F of the electrode layer serves as gate electrode, which is insulated from the semiconductor body 10 by means of the insulation layer 32 and extends from the n-doped zone 74 as far as the n-doped zone 19. This section 40F of the electrode layer is contact-connected by an electrode 94, G2, a conductive channel forming in the lateral direction in the semiconductor body 10 when a drive potential is applied to said gate electrode, so that a charge flow arises between the drain zone 72 and the source zone 74 when a voltage is applied between the drain electrode D2 and the source electrode S2.

The fabrication of the last-described n-doped zones, of the further insulation layer and of the gate electrodes is adequately known from methods for fabricating power transistors and from methods for fabricating lateral transistors; a detailed description of these method steps can therefore be dispensed with.

FIGS. 2A to 2H illustrate a further method for fabricating an electrode of a field-effect-controllable semiconductor component. In this case, as in the method illustrated in FIG. 1, firstly a semiconductor body 10 is provided, which, in the exemplary embodiment, has an n-doped first zone 12 and a p-doped second zone 14 lying above the latter. In the semiconductor body 10, trenches 22A, 22B are formed in the region of the power transistor part II, said trenches extending into the semiconductor body 10 in the vertical direction through the second zone 14. Whereas the trenches 20A, 20B end just below the second zone 14 in the case of the method illustrated in FIG. 1, the trenches 22A, 22B extend further into the semiconductor body in the case of the exemplary embodiment in accordance with FIG. 2A. An insulation layer 30 is applied to the surface of the semiconductor body 10 in the region of the power transistor part I and an insulation layer 32 is applied to said surface in the region of the drive logic part II. Situated on these insulation layers 30, 32 there is a protective layer 100, preferably a nitrite layer.

Figure 2A:
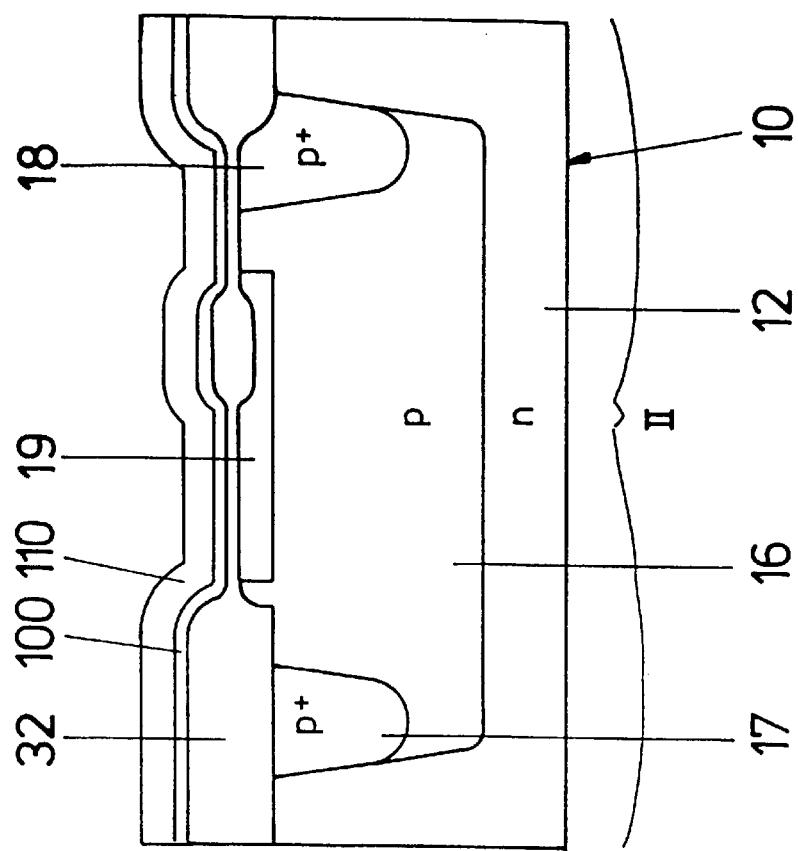
Figure 2A:
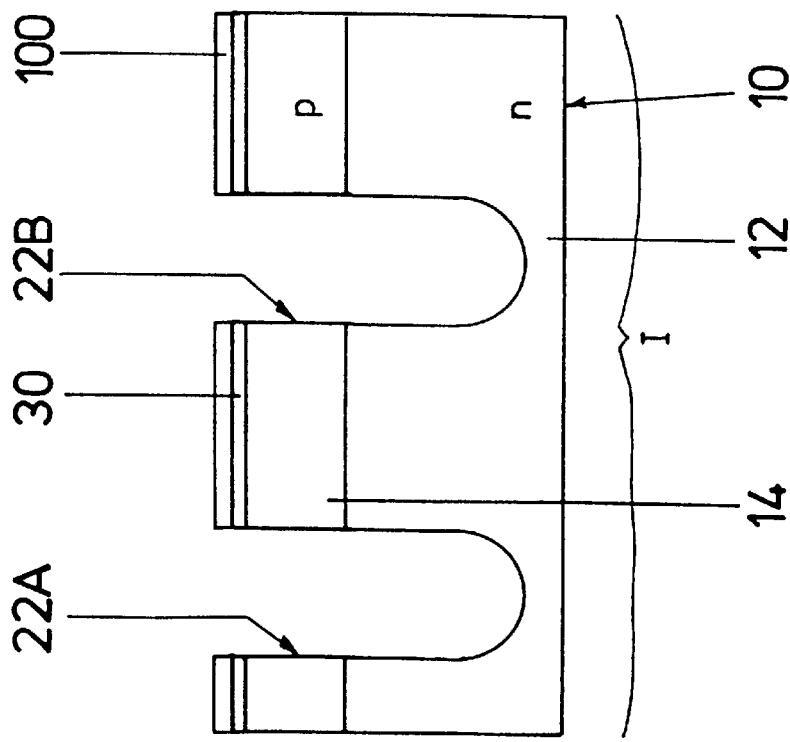
Figure 2B:
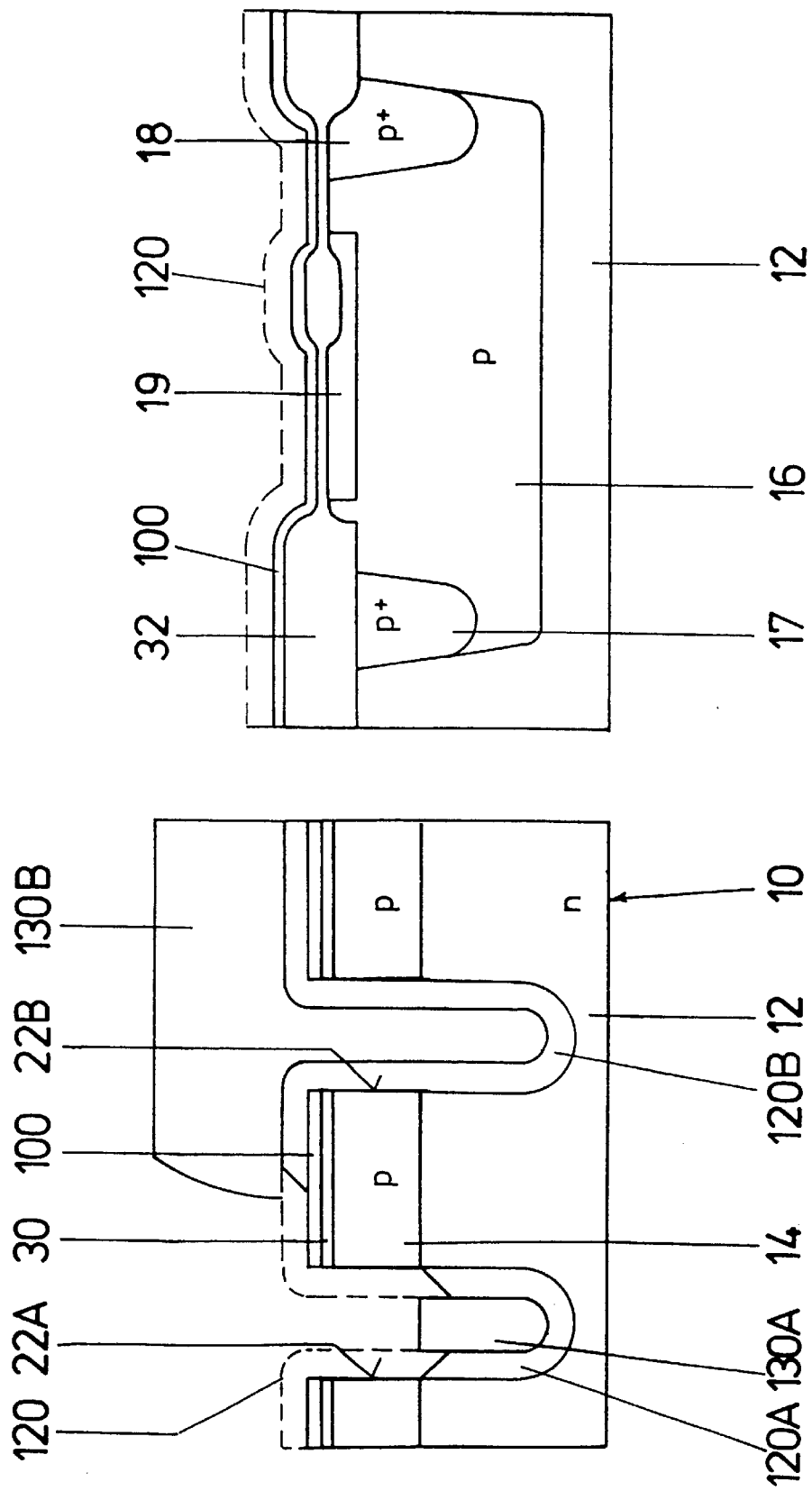

FIG. 2B shows the arrangement in accordance with FIG. 2A after further method steps, in which firstly an insulation layer 120, which is illustrated by broken lines in FIG. 2B, is applied to the entire semiconductor arrangement. In a next method step, a photomask is fabricated, the photomask in the example in accordance with FIG. 2B only forming a plug in one of the trenches 22A, which plug extends upward in height as far as the second zone 14, and the photomask completely covering a second trench 22B in a region 130B. Afterward, the insulation layer 120 is removed, for example by means of an etching method, at all points where it is not covered by the photomask 130A, 130B. As a result, those regions of the insulation layer 120A, 120B which are drawn using solid lines in FIG. 2B remain, which cover the first trench 22A in height about as far as the second zone 14 and completely cover the second trench 22B and, adjoining the second trench 22B, also cover regions of the surface of the semiconductor body 10. The insulation layer 120 is completely removed above the drive part II. The protective layer 100 protects the semiconductor body 10 during the method step in which the insulation layer 120 is partly removed. If silicon is used as semiconductor material, the insulation layer 120 is preferably composed of TEOS and is preferably removed by means of an etching method.

Figure 2C:
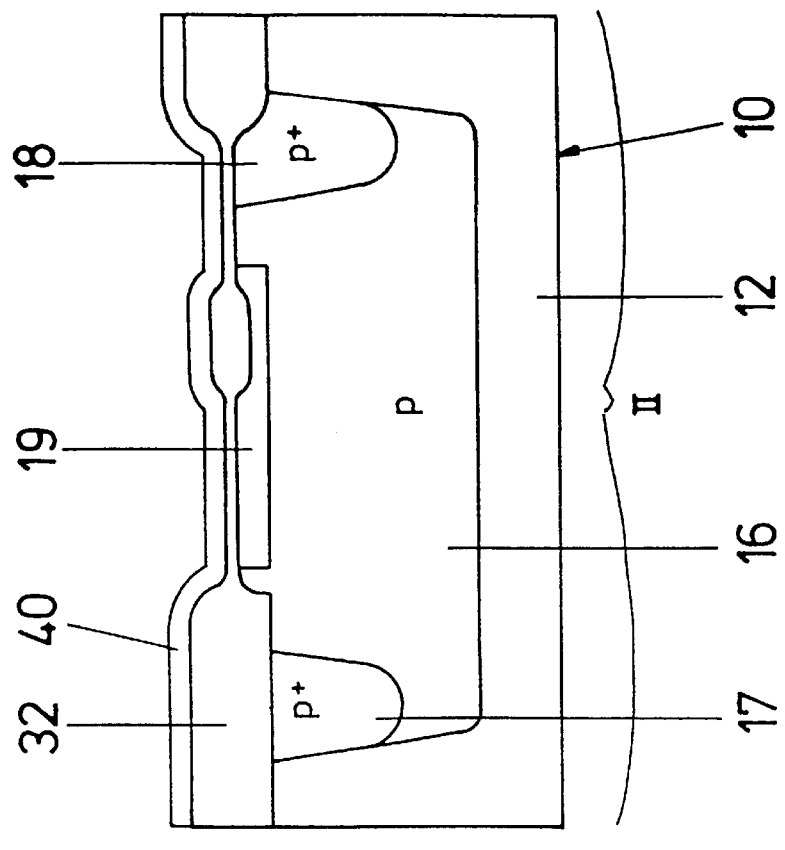
Figure 2C:
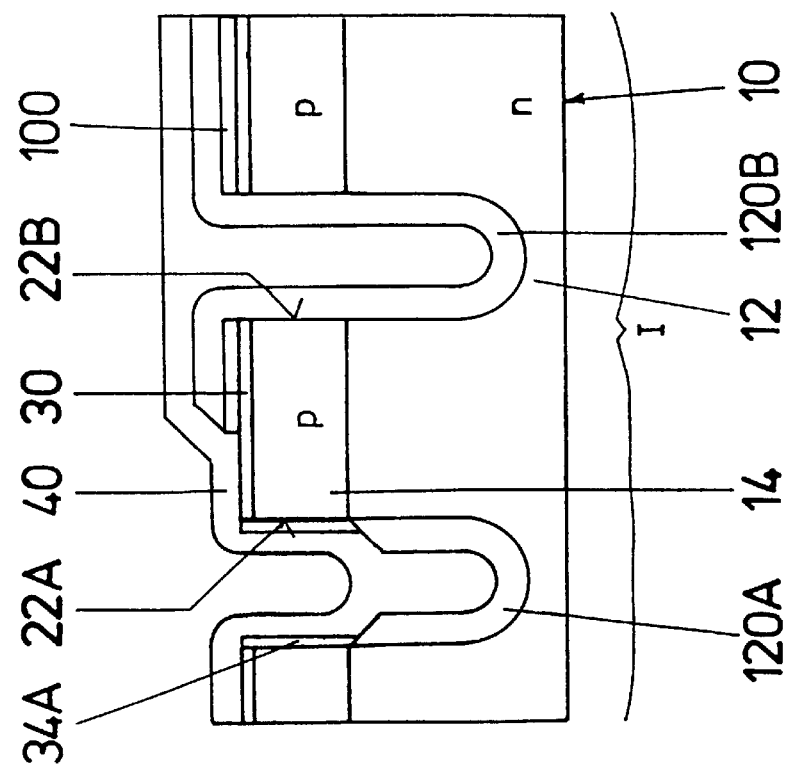
Figure 2D:
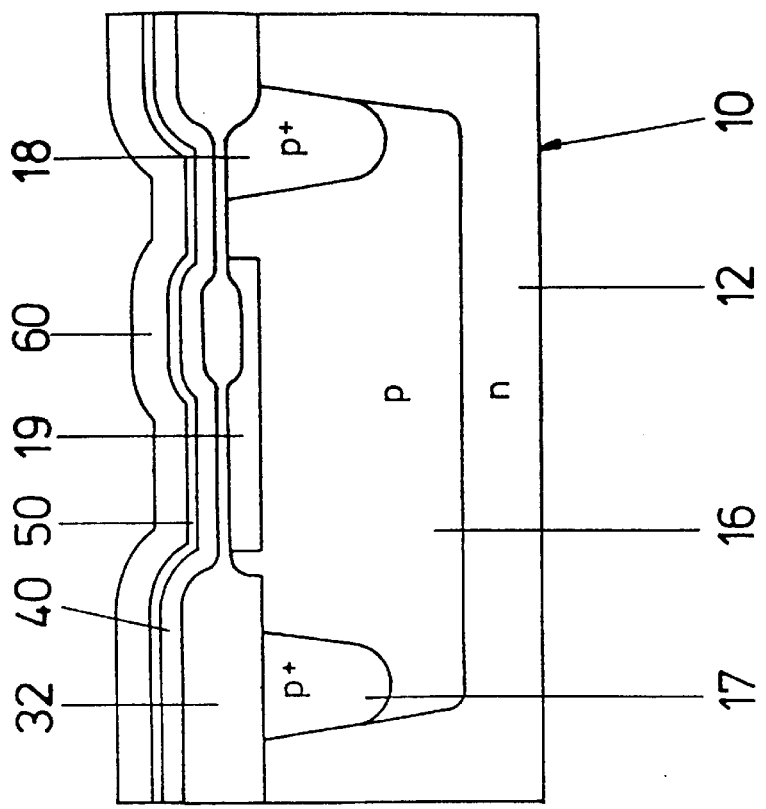
Figure 2D:
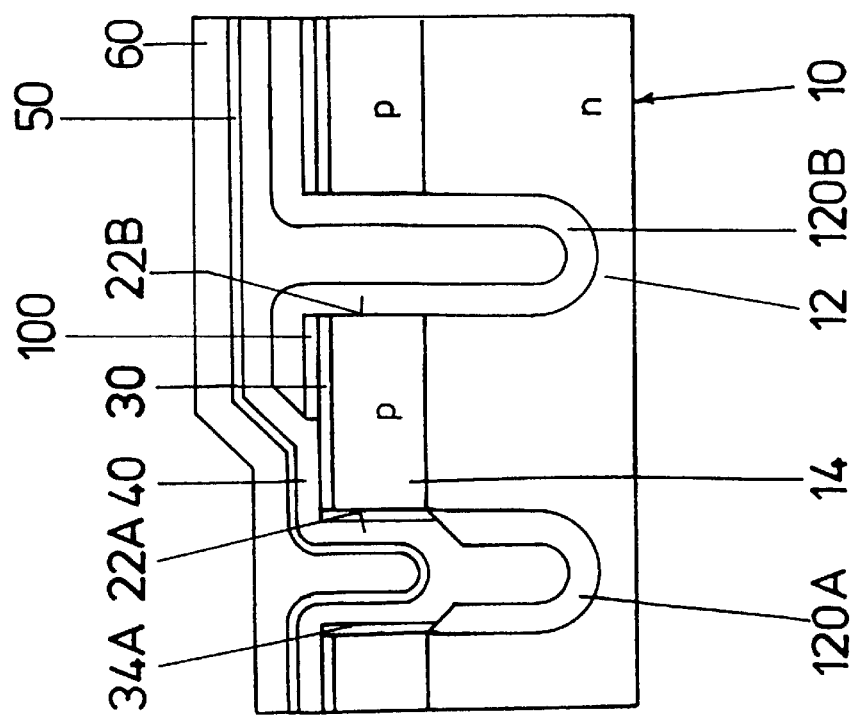

In subsequent method steps, whose result is illustrated in FIG. 2C, the photomask 130A, 130B is removed and the protective layer 100 is removed in the regions which are not covered by the insulation layer 120B.

Afterward, a first insulation layer 34A is fabricated on uncovered regions of the trench 22A in the region of the second zone 14 of the semiconductor body 10. As already explained in the method in accordance with FIG. 1, this insulation layer 34A is fabricated by means of a thermal step, for example. In this case, the insulation layer 34A is thinner than the insulation layer 120A, 120B already produced beforehand. A first layer 40 made of electrode material is subsequently deposited over the entire semiconductor body 10. As has already been explained with respect to FIG. 1C, this first layer 40 made of electrode material completely covers the semiconductor body 10 in the region of the drive logic part II. In the exemplary embodiment in accordance with FIG. 2C, the first electrode layer 40 completely fills the trench 22A in the region of the thick insulation layer 120A. The following method steps illustrated in FIGS. 2D to 2H correspond to the method steps described in FIGS. 1D to 1H, so that reference is made thereto and these method steps are explained with reference to FIGS. 2D to 2H with regard to differences existing between the arrangements according to FIG. 1 and FIG. 2.

After the deposition of the first layer 40 made of electrode material, the intermediate layer 50 is applied to the first electrode layer 40 and afterward the second layer 60 made of electrode material is applied to the intermediate layer. In this case, the second layer 60 is chosen in such a way that the trench 22A, which is not yet completely filled by the first layer 40, is completely filled with electrode material.

Figure 2E:
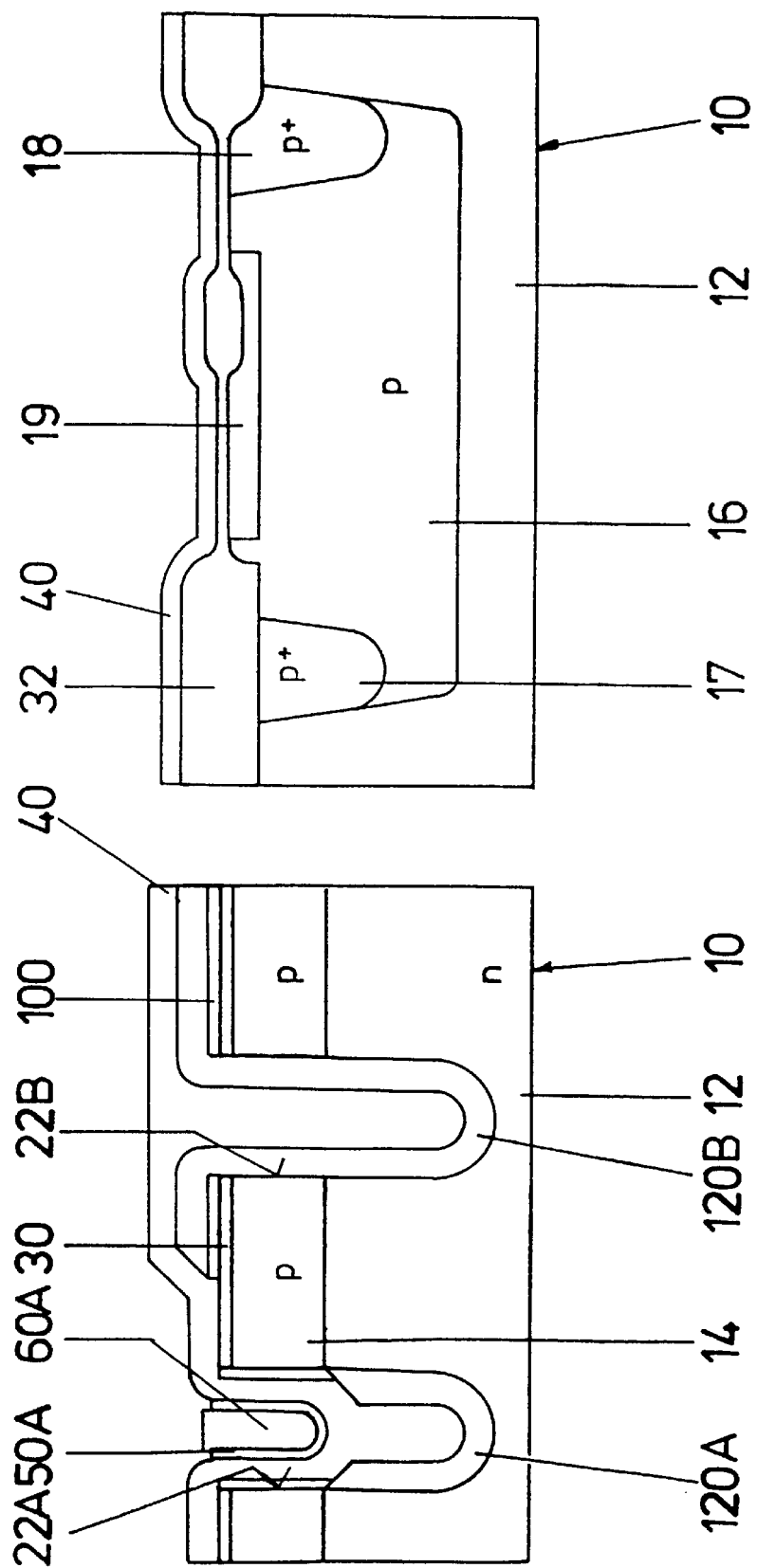

In the next method steps, whose result is illustrated in FIG. 2E, the second electrode layer 60 and the intermediate layer 50 are removed above the semiconductor body 10, parts of the intermediate layer 50A and of the second electrode layer 60A remaining in the trench 22A in order to fill the latter. The second electrode layer 60 and the intermediate layer 50 are removed, as already mentioned, preferably successively in a plurality of method steps.

In a next method step, whose result is illustrated in FIG. 2F, a photomask 170 is applied to the first electrode layer 40 in order to pattern the latter by means of a subsequent etching method. In the exemplary embodiment in accordance with FIG. 2F, unlike in the method illustrated in FIG. 1F, the photomask 170 also covers regions of the power transistor part, namely the first electrode layer 40 above the trench 22B, in order to protect the first electrode layer 40 from being removed in this region.

Figure 2G:
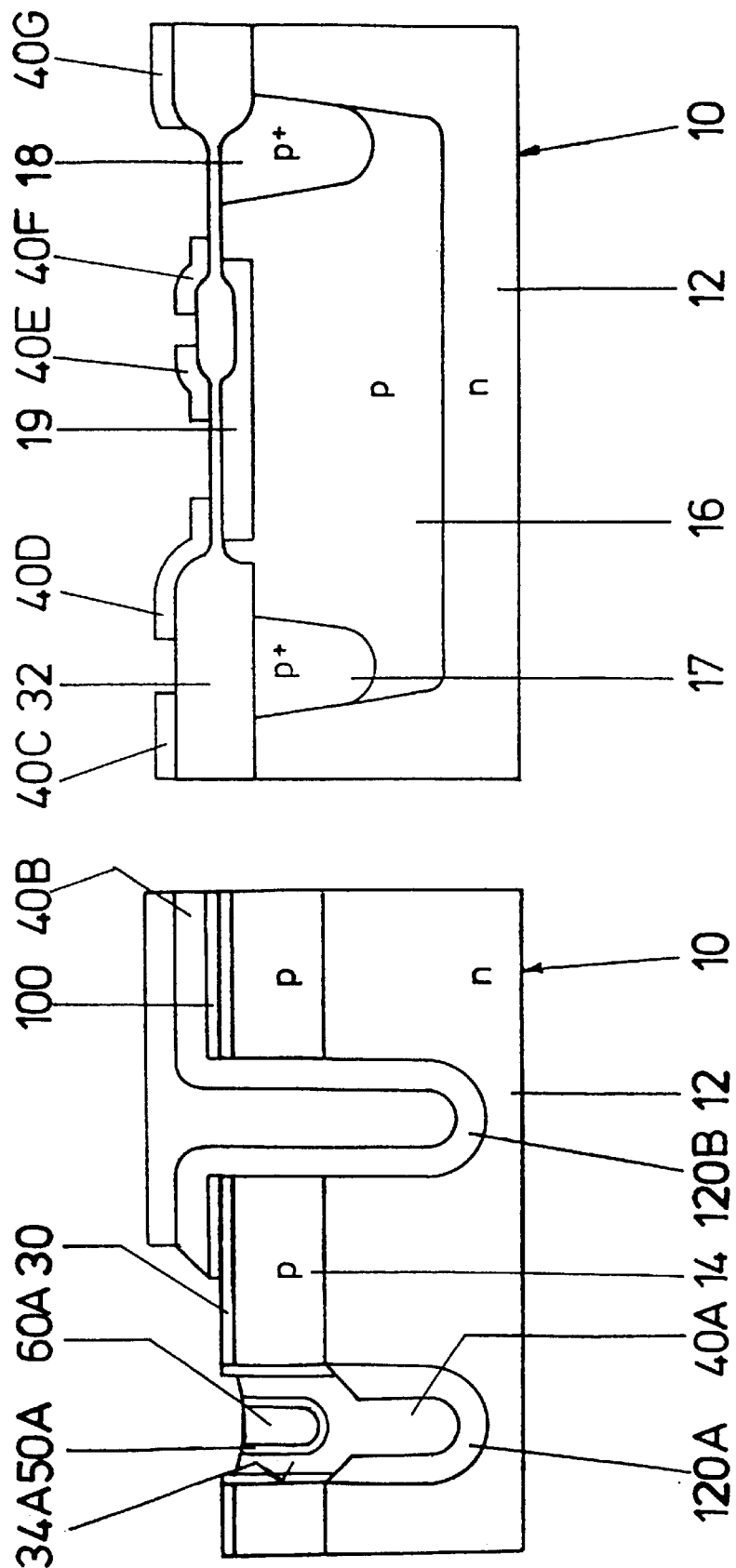

FIG. 2G shows the arrangement in accordance with FIG. 2F after the removal of the first electrode layer 40 in the regions left free by the photomask 170 and after the removal of the photomask 170.

Figure 2H:
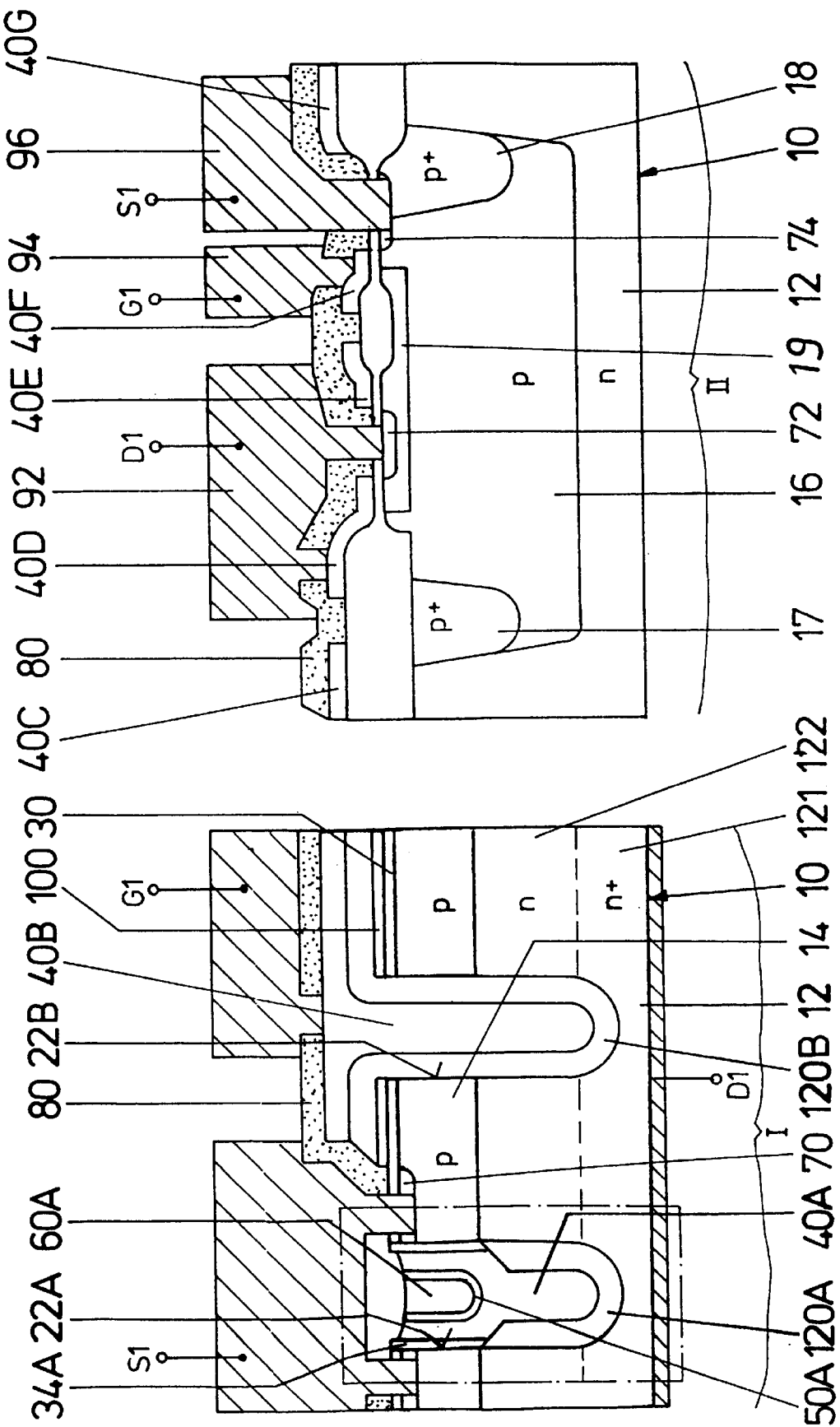

In next method steps, whose result is illustrated in FIG. 2H, n-doped zones 70, 72, 74 are produced in the regions of the front side of the semiconductor body 10 which are not covered by the first layer 40 made of electrode material and are only covered by a thin insulation layer. Afterward, a further insulation layer 80 is fabricated and electrodes for contact-connecting the semiconductor regions 70, 72, 74 and regions of the electrode layer 40F are produced.

The arrangement of the drive logic part II in accordance with FIG. 2H corresponds to the arrangement in FIG. 1H, so that reference is made thereto with regard to the construction and function.

In the power transistor part I, the combination comprising first electrode layer 40A and second electrode layer 60A in the trench 22A in the region of the p-doped second zone 14 forms a gate electrode which is insulated from the semiconductor body 10 by the first insulation layer 34A. That part of the second electrode layer 40A which is formed in the first trench 20A in the region of the second insulation layer 120A, which is thicker than the first insulation layer 34A, acts as a field plate. In a corresponding manner, the electrode layer 40B in the trench 22B acts as a field plate which delimits the power transistor in the lateral direction of the semiconductor body 10. The power transistor preferably comprises a multiplicity of identically constructed structures, as are outlined by the dash-dotted line in FIG. 2H. In this case, these structures adjoin the structure with the trench 22A toward the left in the illustration in accordance with FIG. 2H. The field plate in the second trench 22B is connected to the gate potential of the gate electrode 40A.

The field plate 40B can be electrically connected to the gate electrode sections 40A, 60A in a manner that is not specifically illustrated. To that end, by way of example, provision is made of a trench which runs perpendicularly to the trenches 22A, 22B and with which the trenches 22A, 22B merge and which is filled for example with a conductive material in order to connect the gate electrode 40A, 60A and the field plate 40B to one another.

The field plate 40B in the second trench 22B does not act as a gate electrode since the insulation layer 120B between the electrode 40B and the semiconductor body 10 is too thick to bring about a conductive channel in the second zone 14 when a customary drive potential is applied.

As is illustrated in FIG. 2H, the field plate 40B extends beyond the trench and runs partly above the surface of the semiconductor body 10. The gate electrodes 40A, 60A are contact-connected via the field plate 40B by a terminal electrode G1 which contact-connects the field plate 40B in the part which extends beyond the trench. In this case, the terminal electrode G1 is insulated from the semiconductor body by the comparatively thick insulation layer 120B, which prevents a punch-through of the drain potential present at the drain zone 12 to the terminal electrode G1 for the gate potential.

The contact-connection of the gate electrodes 40A, 60A via the field plate 40B above the trench 22B at the edge of the cell array of the power transistor makes it possible to avoid the voltage spikes that are customary in conventional arrangements in the region of an upper edge of the trenches in which gate electrodes are arranged. In the arrangement according to FIG. 2H, the thick insulation layer 120B accepts the entire voltage between the terminal electrode G1 for the gate potential and a terminal electrode D1 for the drain potential, the latter being designed as a metallization layer on the rear side of the semiconductor body. Further measures, for example suitably doped zones, for preventing a voltage punch-through are thereby unnecessary.

While the drain zone 12 in the figures described above is always represented as an approximately uniformly doped zone, it goes without saying that the drain zone, as is illustrated in FIG. 2H, may have a more heavily doped zone 121 adjoining the drain electrode and a more weakly doped zone 122 between the more heavily doped zone 121 and the channel zone 14.

FIGS. 1H and 2H illustrate a field-effect-controllable semiconductor component according to the invention in each case in the region of the power transistor part. In the exemplary embodiments, said semiconductor component has a semiconductor body having an n-doped drain zone 12 and an n-doped source zone 70, between which a p-doped channel zone 14 is arranged. In the semiconductor body 10 in which the source zone 70, the channel zone 14 and the drain zone 12 are formed, a trench 22 extends in the vertical direction of the semiconductor body 10 through the source zone 70 and the channel zone 14 right into the drain zone 12. In the trench 22A, a gate electrode is formed which is insulated from the semiconductor body 10 by means of an insulation layer 34A, 34B and is arranged at least in the region of the channel zone 14. Said gate electrode has a first electrode section 40A and a second electrode section 60A, between which an intermediate layer 50A is formed.

In the arrangement according to FIG. 2H, the power transistor furthermore has a field plate 40B which is arranged in a trench at the edge of the cell array of the power transistor part I and is insulated from the semiconductor body by means of a thick insulation layer 120B, which is thicker than the insulation layer 34A in the region of the gate electrode 40A, 60A. This field plate is drawn upward out of the trench 22B and extends partly above the surface of the semiconductor body 10. The field plate is electrically conductively connected to the gate electrode 40A and is contact-connected by means of a terminal electrode G1.

In one embodiment of the invention, the gate electrode section 60A is connected to the gate electrode section 40A, while in another embodiment of the invention, provision is made for connecting the two gate electrode sections 40A, 60A to different potentials.

What is claimed is:

1. A field-effect-controllable semiconductor component, comprising:
    a semiconductor body having:
        a first zone of a first conduction type;
        a second zone of a second conduction type; and
        a first trench extending into said semiconductor body in a vertical direction of the semiconductor body through the second zone;
    a control electrode disposed in said first trench;
    a first insulation layer disposed in first trench and insulating said control electrode from said semiconductor body;
    a second insulation layer disposed in said first trench only in a region of said first zone of said semiconductor body said second insulation layer is thicker than said first insulation layer; and
    said control electrode having:
        a first electrode section adjacent said first insulation layer;
        a second electrode section; and
        an intermediate layer disposed between said first and second electrode sections.

2. The semiconductor component according to claim 1, wherein said first electrode section disposed at said second insulation layer.

3. The semiconductor component according to claim 2, further comprising:
   a second trench; and
   wherein said second insulation layer covers said second trench in a region of said first and second zones of the semiconductor body.

4. The semiconductor component according to claim 1, further comprising:
   a second trench; and
   wherein said second insulation layer covers said second trench in a region of said first and second zones of the semiconductor body.

5. The semiconductor component according to claim 3, further comprising a field plate insulated from said semiconductor body by said second insulation layer disposed in said second trench, said field plate electrically conductively connected to said control electrode.

6. A field-effect-controllable semiconductor component, comprising:
   a semiconductor body having:
      a first zone of a first conduction type;
      a second zone of a second conduction type; and
      at least one trench extending into said semiconductor body in a vertical direction of the semiconductor body through the second zone;
   a control electrode disposed in said first trench;
   a first insulation layer disposed in said at least one trench and insulating said control electrode from said semiconductor body;
   a second insulation layer disposed in said at least one trench; and
   said control electrode having:
      a first electrode section adjacent said first insulation layer;
      a second electrode section; and
      an intermediate layer disposed between said first and second electrode sections;
   and;
   a field plate insulated from said semiconductor body by said second insulation layer, said field plate electrically conductively connected to said control electrode.

7. The semiconductor component according to claim 5, including a terminal electrode, said field plate extending partly above said semiconductor body and contacting said terminal electrode.

8. The semiconductor component according to claim 6, including a terminal electrode, said field plate extending partly above said semiconductor body and contacting said terminal electrode.

9. The semiconductor component according to claim 1, wherein said first electrode section and said second electrode section are connected to different potentials.

10. The semiconductor component according to claim 1, wherein said first electrode section and said second electrode section are connected to the same potential.

* * * * *